(12) United States Patent
Nguyen-Xuan et al.

(10) Patent No.: US 12,133,360 B2
(45) Date of Patent: Oct. 29, 2024

(54) COOLING-ELEMENT PART FOR A COOLING ELEMENT OF AN ELECTRICAL DRIVE UNIT WITH DROPLET-SHAPED PINS, COOLING ELEMENT, ELECTRICAL DRIVE UNIT AND MOTOR VEHICLE

(71) Applicant: Bayerische Motoren Werke Aktiengesellschaft, Munich (DE)

(72) Inventors: Thinh Nguyen-Xuan, Erding (DE); Rene Treffler, Augsburg (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 265 days.

(21) Appl. No.: 17/737,749

(22) Filed: May 5, 2022

(65) Prior Publication Data
US 2022/0361369 A1 Nov. 10, 2022

(30) Foreign Application Priority Data

May 6, 2021 (DE) ..................... 10 2021 111 826.3

(51) Int. Cl.
*H05K 7/20* (2006.01)
(52) U.S. Cl.
CPC ..... *H05K 7/20272* (2013.01); *H05K 7/20927* (2013.01)
(58) Field of Classification Search
CPC ................. H05K 7/20272; H05K 7/20927
See application file for complete search history.

(56) References Cited

U.S. PATENT DOCUMENTS

| 3,009,072 A | * | 11/1961 | Mossay | H02K 1/32 310/64 |
| 2010/0244594 A1 | * | 9/2010 | Murakami | H02K 9/20 310/54 |
| 2011/0083834 A1 | * | 4/2011 | Braun | H02K 5/203 29/890.038 |
| 2015/0015096 A1 | * | 1/2015 | Huber | H02K 5/203 310/54 |

(Continued)

FOREIGN PATENT DOCUMENTS

| DE | 199 28 023 A1 | 12/1999 |
| DE | 10 2012 205 404 A1 | 10/2013 |
| DE | 10 2016 210 302 A1 | 12/2017 |

(Continued)

OTHER PUBLICATIONS

German-language Search Report issued in German Application No. 10 2021 111 826.3 dated Dec. 20, 2021 with partial English translation (11 pages).

*Primary Examiner* — Adrian S Wilson
(74) *Attorney, Agent, or Firm* — Crowell & Moring LLP

(57) ABSTRACT

The invention relates to a cooling-element part for a cooling element for cooling at least one component of an electrical drive unit of a motor vehicle and can be joined together with a further cooling-element part to form at least one cooling-fluid-carrying cooling duct to the cooling element, and which has a cooling structure configured to increase a flow resistance for the cooling fluid by producing turbulences in the flow having pins that extend at least partially over a height of the cooling duct, wherein the pins are formed as droplet-shaped having a width that decreases in the direction of the flow of the cooling fluid.

14 Claims, 4 Drawing Sheets

(56) References Cited

U.S. PATENT DOCUMENTS

2020/0376615 A1 12/2020 Koenig et al.
2020/0412183 A1* 12/2020 Bolotnikov ............ H02K 5/203

FOREIGN PATENT DOCUMENTS

| DE | 10 2016 216 019 A1 | 3/2018 |
| --- | --- | --- |
| DE | 10 2016 225 521 A1 | 6/2018 |
| DE | 10 2018 129 983 A1 | 5/2020 |
| DE | 10 2019 207 830 A1 | 12/2020 |

* cited by examiner

COOLING-ELEMENT PART FOR A COOLING ELEMENT OF AN ELECTRICAL DRIVE UNIT WITH DROPLET-SHAPED PINS, COOLING ELEMENT, ELECTRICAL DRIVE UNIT AND MOTOR VEHICLE

CROSS REFERENCE TO RELATED APPLICATION

This application claims priority under 35 U.S.C. § 119 from German Patent Application No. DE 10 2021 111 826.3, filed May 6, 2021, the entire disclosure of which is herein expressly incorporated by reference.

BACKGROUND AND SUMMARY

The invention relates to a cooling-element part, which is intended for a cooling element for cooling at least one component of an electrical drive unit of a motor vehicle and can be joined together with a further cooling-element part to form at least one cooling-fluid-carrying cooling duct to the cooling element and which has a cooling structure, the cooling structure being designed to represent a flow resistance for the cooling fluid and to produce additional turbulences in the flow of the cooling fluid. For this purpose, the cooling structure has pins, which extend at least partially over a height of the cooling duct. The invention also relates to a cooling element, to an electrical drive unit and to a motor vehicle.

Of particular interest in the present case are electrically drivable motor vehicles, for example electric or hybrid vehicles. Such motor vehicles usually have an electrical drive system with a number of interconnected drive units. The drive units are for example an electric drive machine or electric machine, an electrical energy store and power electronics, for example an inverter, which is connected between the electric drive machine and the electrical energy store. For cooling these drive units during the operation of the drive system, the prior art discloses for example cooling elements which are arranged on components of the drive units and carry a cooling fluid for transporting away waste heat of the components. Such cooling elements may be for example cooling plates with cooling ducts, which are mounted on battery cells of the electrical energy store or on components of the power electronics and provide convective cooling of the components.

In the case of an electric drive machine, the cooling elements may be for example cooling housings or cooling jackets, which surround a stator of the electric drive machine and have cooling ducts. DE 10 2016 225 521 A1 and DE 10 2012 205 404 A1 describe cooling housings for stators of electric machines which comprise meandering cooling ducts. These meandering cooling ducts are generally used in the case of one-part cooling housings that are produced by means of casting processes. Although such cooling ducts provide a permanent and sufficient cooling capacity, they are complex to produce.

In this respect, DE 10 2018 129 983 A1 discloses a, for example cuff-like, cooling element, formed by two metal sheets, for a stator of an electric machine. One of the sheets is in this case formed without being structured. The other sheet is structured with depressions and elevations, the sheets being joined together in the region of the depressions and forming in the region of the elevations at least one cooling duct carrying the cooling fluid. The depressions are in this case round joining locations, which form pins with a round, circular cross section. At these pins, turbulences are caused in the flowing cooling fluid. In comparison with a laminar flow, which a gap-shaped cooling duct with a free flow cross section would cause, such a turbulent flow results in a higher cooling capacity.

The object of the present invention is to provide a solution by means of which a cooling capacity of a cooling element for a drive unit of an electrically drivable motor vehicle can be further increased in comparison with the prior art.

This object is achieved according to the invention by a cooling-element part, a cooling element, a drive unit and a motor vehicle with the features according to the present disclosure. Advantageous embodiments of the invention are also the subject of the description and the figures.

A cooling-element part according to the invention for a cooling element, which is designed for cooling at least one component of an electrical drive unit of a motor vehicle, can be joined together with a further cooling-element part to form at least one cooling-fluid-carrying cooling duct to the cooling element. The cooling-element part has a cooling structure, which is designed to increase a flow resistance for the cooling fluid by producing turbulences in the flow. For this purpose, the cooling structure has pins, which extend at least partially over a height of the cooling duct. The pins are formed as droplet-shaped and for this purpose have a width that decreases in a direction of flow of the cooling fluid.

The invention also concerns a cooling element for an electric drive unit for cooling at least one component of the drive unit. The cooling element has at least two cooling-element parts, which are joined together to form at least one cooling duct, at least one of the cooling-element parts being formed as the cooling-element part according to the invention. The cooling element is preferably formed as a cooling jacket, which at least partially surrounds the at least one component and forms a cooling housing for the at least one component. The cooling element formed as a cooling housing may consequently also be designed for holding or fixing the component in an intended position and/or for protecting the at least one component. For example, the cooling housing may protect the at least one component from environmental influences, for example moisture or dirt, or from mechanical loading, for example in the event of impact-related shocks on the drive unit. The cooling-element parts are formed as housing parts, one of the housing parts forming an inner wall, facing the component, and consequently being formed as an inner housing, and the other of the housing parts forming an outer wall of the housing, facing a surrounding area, and consequently being formed as an outer housing.

The invention also relates to a drive unit for an electrically drivable motor vehicle having at least one component and a cooling element according to the invention. The drive unit may for example be formed as an electric drive machine, an electrical energy store, for example a high-voltage battery, or power electronics. The at least one component may in this case be for example a battery cell of the electrical energy store or a power switch of the power electronics. The cooling element may for example form an energy store housing for a multiplicity of interconnected energy storage cells of the electrical energy store or a switch housing for the power switches of the power electronics. Preferably, the component is a stator of the electric drive machine, so that the cooling element is formed as a hollow-cylindrical, jacket-like stator housing with sleeve-shaped, hollow-cylindrical cooling-element parts for cooling the stator of an electric drive machine.

The cooling element has the at least one cooling duct or flow space, which is designed for conducting the cooling fluid, for example a cooling liquid, along at least one side of the at least one component and thereby removing heat given off by the at least one component during the operation of the drive unit. This at least one cooling duct is an intermediate space of the double-walled, multi-part cooling element, which is formed by joining together the cooling-element parts. The cooling-element parts may for example be formed as metal sheets of a material with good thermal conductivity, for example aluminum. The at least one cooling duct in this case extends between two end portions opposite one another of the cooling element. A length of the cooling duct corresponds in particular to a length of the cooling element.

The cooling fluid may for example be provided by a cooling circuit of the motor vehicle. The cooling element may have a cooling-fluid connection, which is fluidically coupled to the at least one cooling duct of the cooling element and can be coupled to cooling-fluid lines of the cooling circuit. The cooling-fluid connection may have a fluid inlet, by way of which cooling fluid can be introduced into the at least one cooling duct, and a fluid outlet, by way of which cooling fluid can be removed from the at least one cooling duct. The fluid inlet and the fluid outlet may for example be arranged at the end portions opposite one another of the cooling element. The fluid inlet and the fluid outlet consequently lie opposite one another in the direction of flow of the cooling fluid, which extends along a direction of extent or longitudinal direction of the cooling element.

A cooling capacity provided by the cooling element depends inter alia on a geometry of the at least one flow space by which the nature of the flow of the cooling fluid, and consequently a flow resistance for the cooling fluid, are influenced. While meandering, but complex-to-produce cooling ducts provide a high cooling capacity because of the turbulent flow of the cooling fluid that is produced, the cooling capacity in the case of simple cooling ducts, which cause a substantially laminar flow of the cooling fluid, is lower or even insufficient. Such cooling ducts with simple geometries may take the form of gaps and have large free flow cross sections, these cooling ducts conducting the cooling fluid in particular mainly axially along the direction of extent of the cooling duct and thereby not deflecting the cooling fluid, or only scarcely.

In order to increase the cooling capacity, a cooling structure which produces turbulences in the cooling fluid flow is provided. This cooling structure is formed on at least one of the cooling-element parts and has a number of pins or elevations. In the case of a cooling element in the form of a cooling jacket, the cooling structure is formed for example on an inner housing forming the inner wall. This cooling structure permanently deflects the cooling fluid flow along the direction of flow of the cooling fluid, and consequently produces turbulences in the flow and prevents the formation of the thermal boundary layer, which should be as thin as possible for a high convective heat transfer. As a result, the flow resistance of the at least one cooling duct is increased. This increased flow resistance has the effect of also increasing the cooling capacity of the cooling element in comparison with a laminar flow and additionally leads to a more homogeneous flow distribution in the at least one cooling duct.

The pins can in this case have any desired cross-sectional shape, for example round, elliptical or rectangular. However, it has proven to be particularly advantageous if the pins are formed with a droplet-shaped cross section and extend between the housing parts in particular over an entire height of the at least one cooling duct. The droplet-shaped pins are preferably produced by roll shaping or roll forming or casting. For this purpose, the housing parts are joined together, for example pressed, in such a way that they are preferably in contact with one another in the region of the pins. In the case of a cooling element in the form of a hollow-cylindrical, jacket-like stator housing, the pins extend in a radial direction. The width or a diameter of the pins in this case extends in a direction which is oriented transversely to the direction of flow and in the case of a hollow-cylindrical cooling jacket corresponds to a circumferential direction. For the forming of the droplet shape, this width or this diameter decreases in the direction of flow, so that the pins have a first width on a first side, facing the fluid inlet, and have a second width, smaller in comparison with the first width, on a second side, facing the fluid outlet. The pins therefore taper downstream. As a result, the region of the flow separation downstream of the pins can be minimized, and consequently the pressure loss can be additionally kept low.

As compared with a cooling element with a meandering cooling geometry, the cooling element with the droplet-shaped cooling geometry achieves an increase in the cooling capacity or a temperature reduction of the component with the same pressure loss. Furthermore, the droplet shape has the effect of minimizing a dead water zone or wake. As compared with round pins, the droplet-shaped pins have the advantage that they have a lower pressure loss and a greater surface required for the heat exchange. The multi-part form of the cooling element also allows such a flow geometry, having droplet-shaped pins, to be produced in an easy way, for example by means of roll forming of a metal sheet that forms one of the cooling-element parts.

It proves to be advantageous if at least two pins are arranged next to one another in a row transversely to the direction of flow and at least two rows with pins are arranged along the direction of flow, the pins of two adjacent rows along the direction of flow being arranged offset in relation to one another. In the case of a cylindrical cooling element, therefore at least two pins are arranged next to one another along the circumferential direction. Along the axial direction, which corresponds to the direction of flow, at least two rows of pins are arranged next to one another. The pins are in this case not arranged in rows in line with one another along the direction of flow but offset in relation to one another. This means that the pins of one row are arranged level with a gap between two pins of an adjacent row. This offset arrangement of the pins provides a continuous deflection of the flow and additional turbulences, and consequently a further increase in the cooling capacity.

Preferably, the cooling structure has webs, which at least partially extend over the length of the at least one cooling duct along the direction of flow and are of a wave-shaped form. The webs form wave-shaped longitudinal ribs, which on the one hand provide stiffening to increase the mechanical strength of the cooling element and on the other hand provide additional turbulences in the cooling fluid flow. In this case, in particular a web is arranged in each case between two zones with pins, or pin zones, so that, transversely to the direction of flow, for example in the circumferential direction, zones with pins and webs are alternately arranged. Each pin zone has a number of rows with pins, the pin zones extending at least partially over the length of the cooling duct.

In a development of the invention, in at least one end portion of the housing part that forms an inflow region and/or an outflow region of the cooling element for the cooling fluid, the cooling structure has further pins, which are designed for homogenizing the cooling fluid flow. For example, only the outflow region coupled to the cooling fluid outlet has the further pins. The inflow region may be formed without any structure, that is to say without pins and webs. The further pins are in particular elliptically formed, a main axis of first, further elliptical pins being oriented transversely to the direction of flow and a main axis of second, further pins being oriented along the direction of flow. For example, the cooling structure may have a number of adjacent rows along the direction of flow with elliptical pins of which the main axis is oriented transversely to the direction of flow and one row with elliptical pins of which the main axis is oriented along the direction of flow. These additional pins can additionally control the guidance of the flow and ensure a uniform, homogeneous flow distribution, in particular where the cooling fluid exits the cooling element.

The invention also concerns a motor vehicle having at least one drive unit according to the invention. The motor vehicle is in particular designed as an electric or hybrid vehicle and may for example have a number of differently designed drive units in the form of an electric drive machine, an electrical energy store and a power electronics.

The embodiments presented with respect to the cooling-element part according to the invention and their advantages apply correspondingly to the method according to the invention, to the cooling element according to the invention, to the drive unit according to the invention and to the motor vehicle according to the invention.

Further features of the invention emerge from the claims, the figures and the description of the figures. The features and combinations of features mentioned above in the description and the features and combinations of features mentioned in the description of the figures below and/or shown in the figures alone can be used not only in the respectively stated combination but also in other combinations or alone.

The invention is now explained in more detail on the basis of a preferred exemplary embodiment and also with reference to the drawings.

Other objects, advantages and novel features of the present invention will become apparent from the following detailed description of one or more preferred embodiments when considered in conjunction with the accompanying drawings.

DETAILED DESCRIPTION OF THE DRAWINGS

In the figures, elements that are the same or functionally the same are provided with the same designations.

Figure 1:
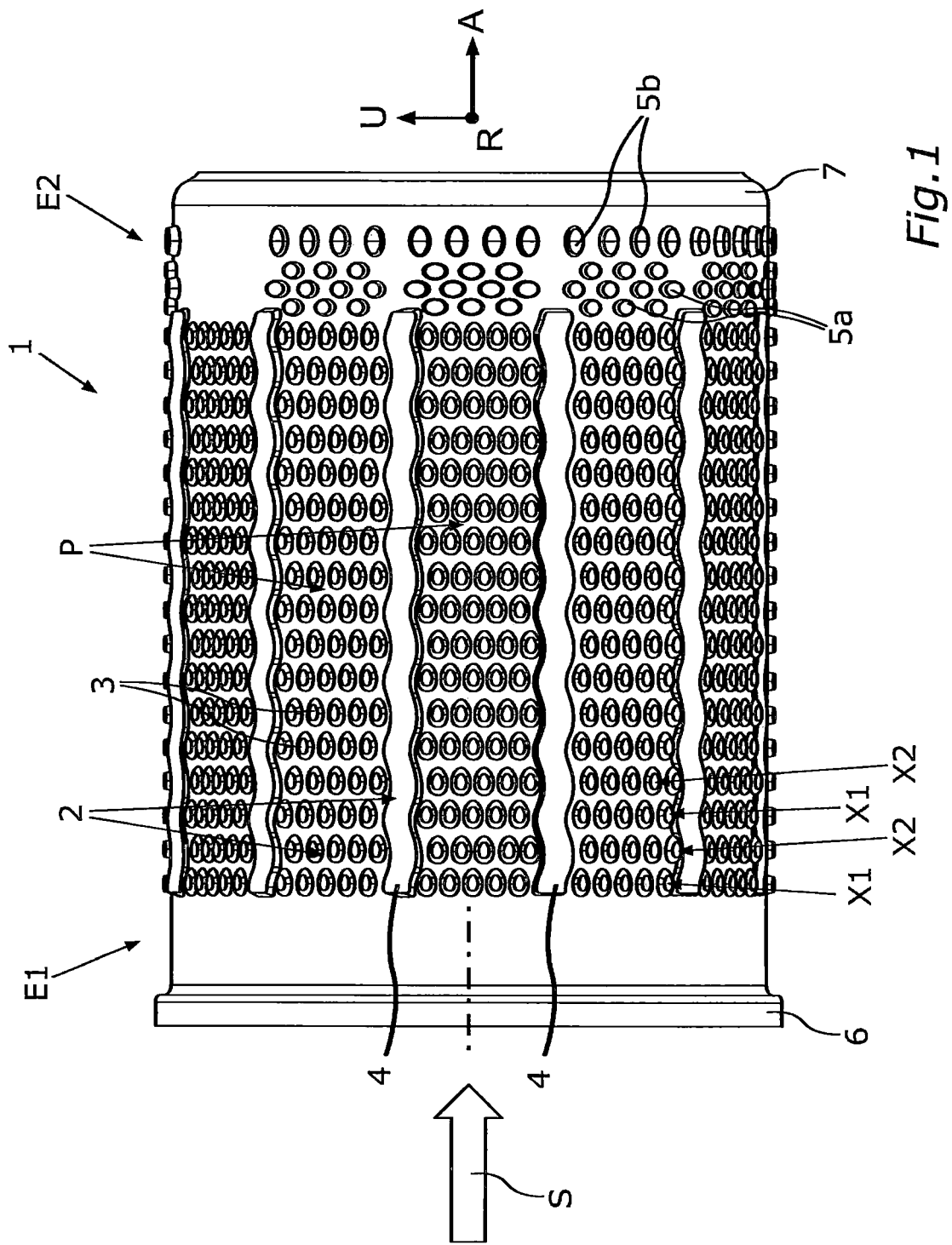
FIG. 1 shows a schematic representation of a cooling-element part for a cooling element for a component of an electrical drive unit from a first perspective.
Figure 2:
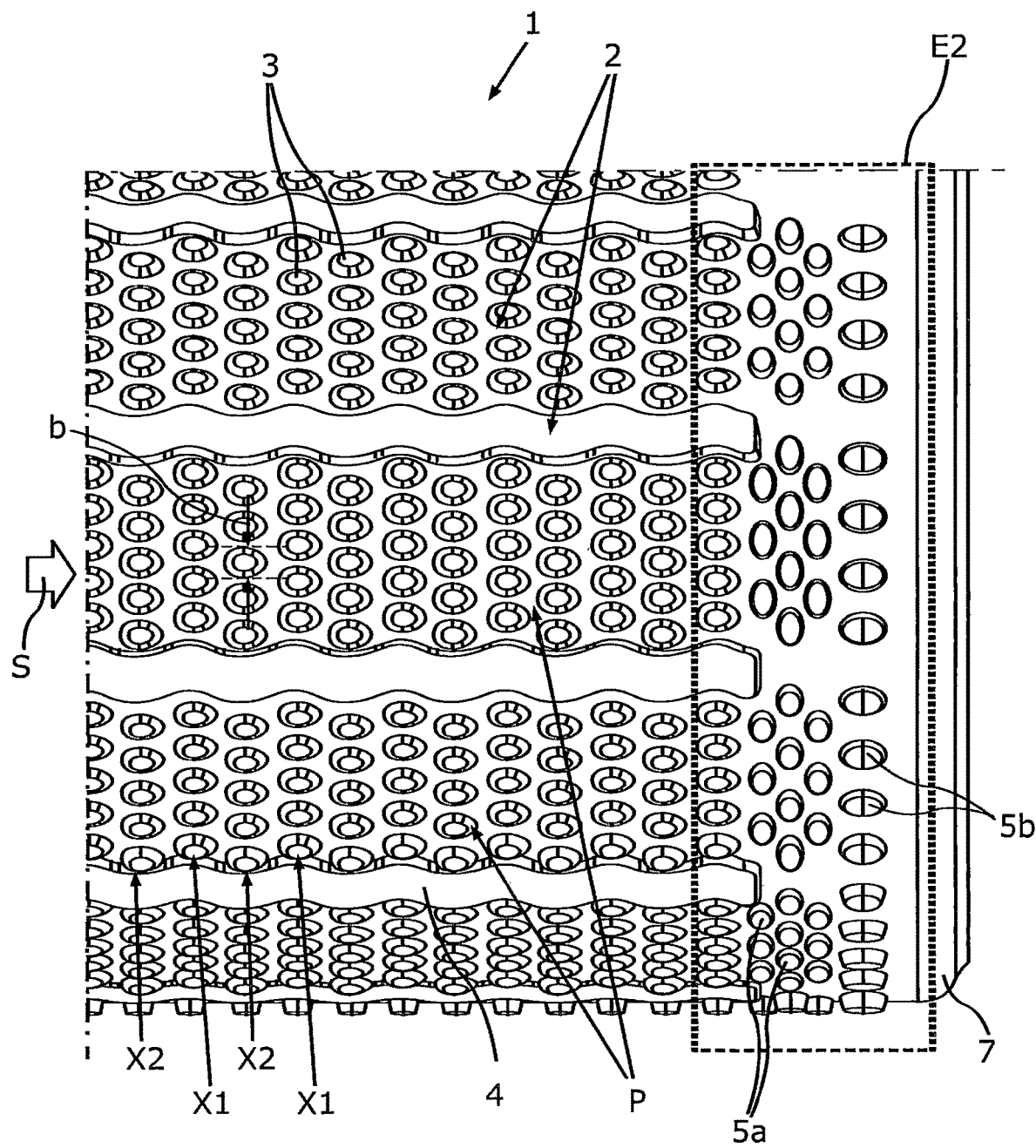
FIG. 2 shows an enlarged detail of the cooling-element part according to FIG. 1.
Figure 3:
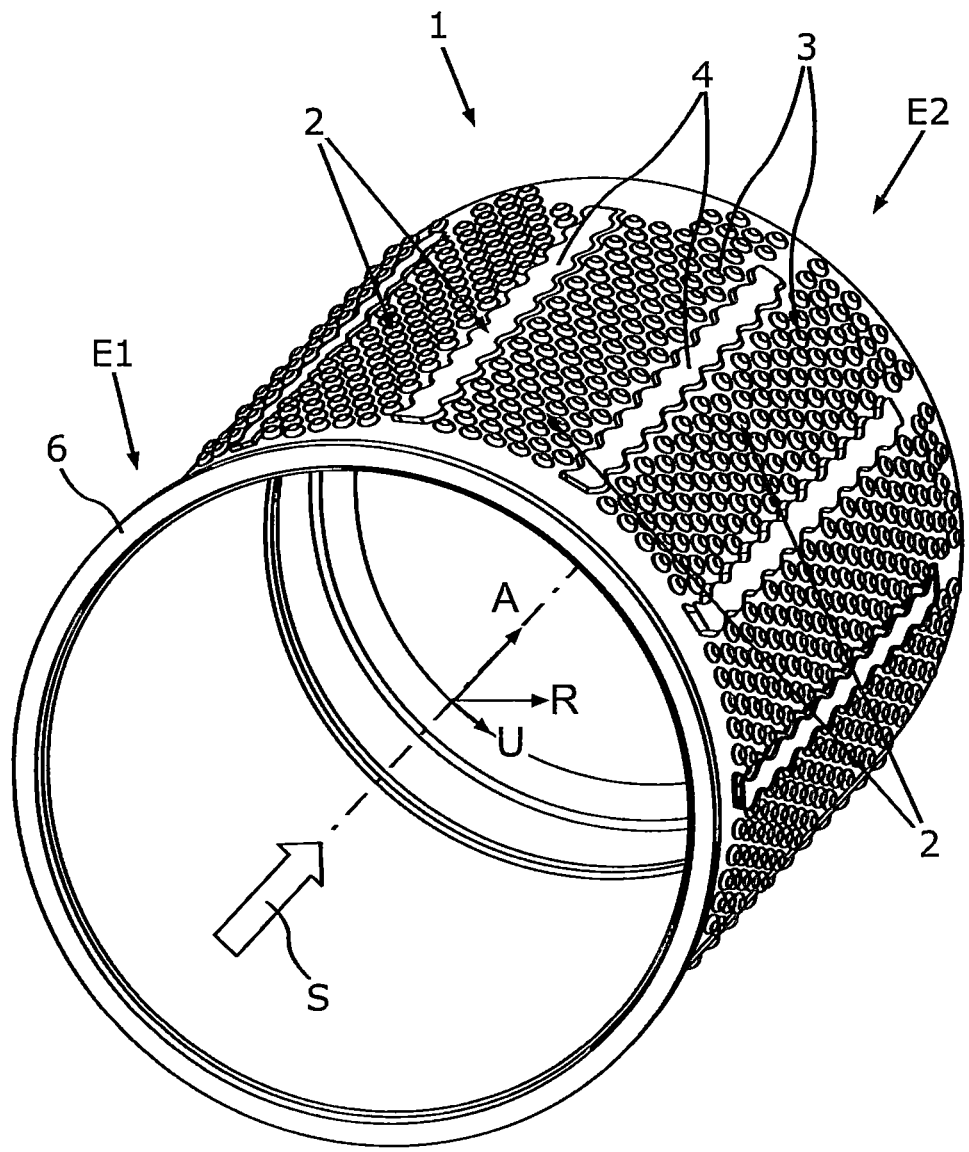
FIG. 3 shows a schematic representation of the cooling-element part from a second perspective.
Figure 4:
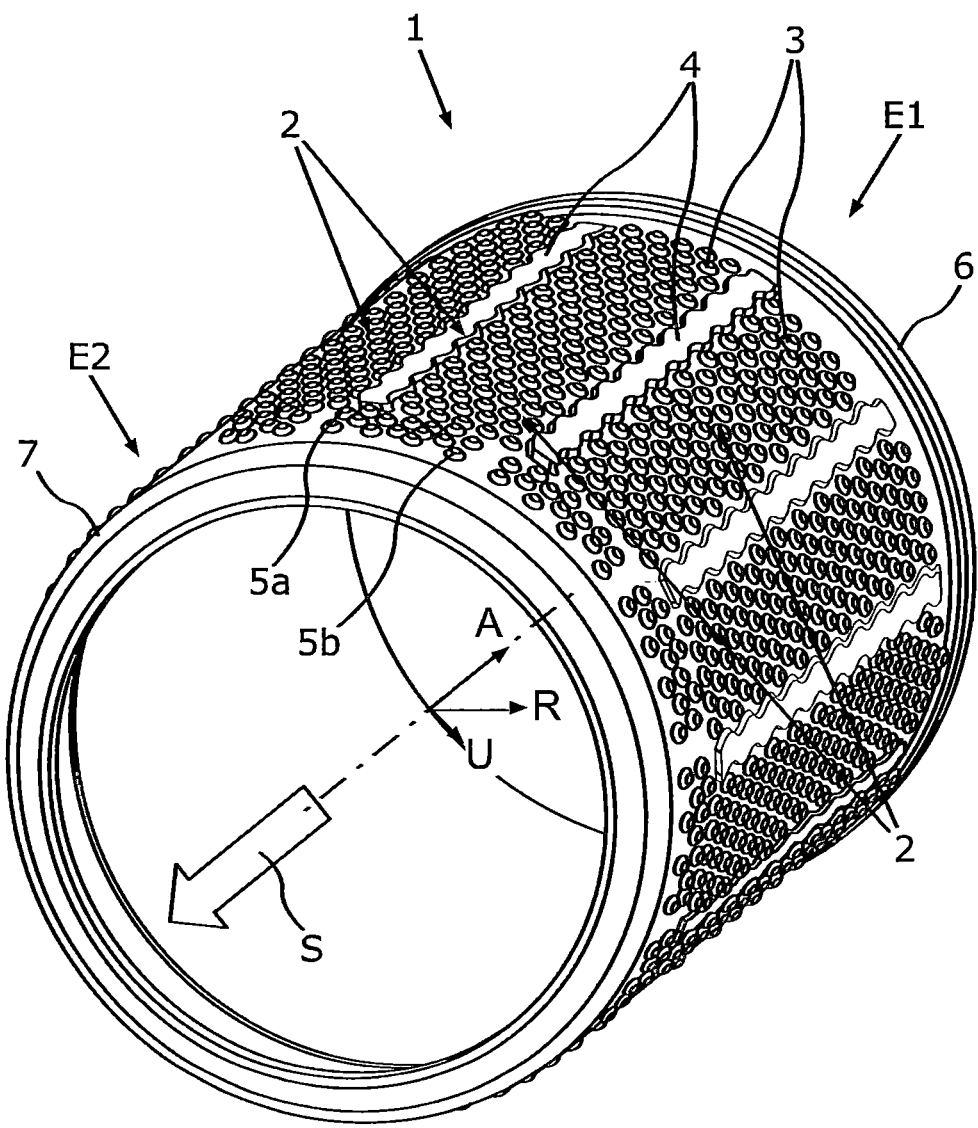
FIG. 4 shows a schematic representation of the cooling-element part from a third perspective.

FIG. 1, FIG. 2, FIG. 3 and FIG. 4 show different perspective representations of a cooling-element part 1, which forms with a further cooling-element part a double-walled, multi-part cooling element for a component of an electrical drive unit of an electrically drivable motor vehicle. The cooling element forms here a multi-part, jacket-like cooling housing of the component. The cooling element serves here for cooling a component in the form of a cylindrical stator of an electric drive machine of the motor vehicle. The cooling element is therefore of a hollow-cylindrical form here, so that the cooling-element part 1 and the further cooling-element part not shown here are likewise of a hollow-cylindrical or sleeve-shaped form. The cooling element can guide a cooling fluid along a direction of flow S, which here is oriented along an axial direction A of the hollow-cylindrical cooling-element part 1. For this purpose, an intermediate space formed by the cooling-element part 1 and the further cooling-element part forms at least one flow space or at least one cooling duct for the cooling fluid. The cooling-element part 1 shown here is an inner housing, and consequently forms an inner wall, facing the component, of the cooling housing. It may however also be that the cooling-element part 1 is an outer housing and forms an outer wall, facing the surrounding area.

The cooling-element part 1 is structured and as a result has a cooling structure 2, which is designed to increase a flow resistance for the cooling fluid in the flow space by producing turbulences in the flow. The cooling structure 2 is in this case formed on a surface of the cooling-element part 1 that is assigned to the further cooling-element part. The further cooling-element part may be of an unstructured form and have a smooth surface. The cooling structure 2 may for example be stamped into the sheet-like cooling-element part 1. The cooling structure 2 has pins 3, which here are oriented in a radial direction R and, in the joined-together state of the cooling element, extend from the cooling-element part 1 to the further cooling-element part over an overall height of the cooling duct. The pins 3 have in this case a droplet shape, so that a width b of the pins 3 decreases downstream, that is to say in the direction of flow S. These droplet-shaped pins 3 have the effect that the cooling structure 2 has a reduced boundary-layer separation in comparison with round pins, and as a result a low pressure loss and a high convective heat transport.

The pins 3 are in this case arranged here in pins zones P. Each pin zone P has at least two rows X1, X2, with in each case at least two pins 3. The pins 3 are arranged next to one another transversely to the direction of flow, here along the circumferential direction U, the rows X1, X2 being alternately arranged in the direction of flow S. In this case, the pins 3 of the rows X1 are arranged offset with respect to the pins 3 of the rows X2. The offset arrangement of the droplet-shaped pins 3 has the advantage as compared with an in-line arrangement of the pins 3, in which the pins 3 are arranged in parallel-running columns or lines oriented along the direction of flow S, that as a result the buildup of a thermal boundary layer can be disrupted, and consequently a higher convective heat transfer at a wall of the housing can be achieved. The thinner the thermal boundary layer, the higher the convective heat transfer. The cooling structure 2 also preferably has wave-shaped webs 4, which extend along the direction of flow S. In this case, a web 4 is arranged in each case between two pin zones P. The webs 4 provide further turbulences in the flow and increased stiffness of the cooling element.

The cooling-element part 1 also has two end portions E1, E2, a first end portion E1 forming an inflow region for the cooling fluid into the cooling element and a second end portion E2 forming an outflow region for the cooling fluid out of the cooling element. Here, further pins 5a, 5b, which have for example an elliptical shape and are designed for homogenizing the cooling fluid flow, are arranged in the second end portion E2, forming the outflow region. First of the further pins 5a are in this case arranged in such a way that a main axis of the, for example elliptical, pins 5a is oriented along the circumferential direction U, and second of the further pins 5b are in this case arranged in such a way that a main axis of the, for example elliptical, pins 5b is oriented along the direction of flow S. The first further pins 5a are in this case arranged in a number of rows, the pins 5a of two successive rows likewise being arranged offset in relation to one another.

Furthermore, the cooling-element part 1 has here a collar 6 on one end portion E1 and a constriction 7 on the axially opposite end portion E2. The collar 6 and the constriction 7 serve for mechanically connecting, for example welding, to the further cooling-element part to form the cooling element.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A cooling-element part for a cooling element for cooling at least one component of an electrical drive unit of a motor vehicle, the cooling-element part configured to:
   join together with a further cooling-element part to form at least one cooling-fluid-carrying cooling duct of the cooling element between the cooling-element and the further cooling-element part, wherein a direction of flow of the cooling fluid relative to the cooling-element part is the same across all cooling-fluid-carrying cooling ducts of the cooling-element part;
   wherein the cooling-element part comprises:
   a cooling structure configured to increase a flow resistance for cooling fluid by producing turbulences in the flow of the cooling fluid, the cooling structure comprising a plurality of pins that extend at least partially over a height of the cooling duct,
   wherein the pins are droplet-shaped having a width that decreases in the direction of the flow of the cooling fluid, and
   wherein the cooling structure comprises webs that at least partially extend over a length of the at least one cooling duct along the direction of the flow and are wave-shaped along the direction of the flow.

2. The cooling-element part according to claim 1, wherein at least two pins of the plurality of pins are arranged next to one another in a row transversely to the direction of the flow, and at least two rows with pins are arranged along the direction of the flow, and
   the pins of two adjacent rows of the at least two rows along the direction of the flow are arranged offset in relation to one another.

3. The cooling-element part according to claim 1, wherein the cooling structure comprises further pins configured to homogenize the cooling fluid flow on at least one end portion of the cooling-element part that forms at least one of an inflow region or an outflow region of the cooling element for the cooling fluid.

4. The cooling-element part according to claim 3, wherein the further pins have an elliptical form,
   wherein a main axis of a first set of the further pins are oriented transversely to the direction of the flow, and
   a main axis of a second set of the further pins are oriented along the direction of the flow.

5. The cooling-element part according to claim 1, comprising a hollow-cylindrical form, forming a hollow-cylindrical cooling element for cooling a stator of an electric drive machine.

6. The cooling-element part according to claim 1, wherein the droplet-shaped pins comprise roll-shaped pins or cast pins.

7. A cooling element, comprising:
   at least one cooling-element part according to claim 1,
   wherein the at least one cooling-element part is joined together with the further cooling-element part to form the at least one cooling duct, and
   wherein the cooling element is for an electric drive unit for cooling at least one component of the drive unit.

8. A drive unit for an electrically drivable motor vehicle having at least one component, the drive unit comprising:
   a cooling element according to claim 7,
   wherein the drive unit comprises at least one of an electric machine, a high-voltage battery, or an inverter.

9. A motor vehicle comprising:
   at least one drive unit according to claim 8.

10. The cooling-element part according to claim 2, wherein
    the cooling structure comprises further pins configured to homogenize the cooling fluid flow on at least one end portion of the cooling-element part that forms at least one of an inflow region or an outflow region of the cooling element for the cooling fluid.

11. The cooling-element part according to claim 10, wherein
    the further pins have an elliptical form,
    wherein a main axis of a first set of the further pins are oriented transversely to the direction of the flow, and
    a main axis of a second set of the further pins are oriented along the direction of the flow.

12. The cooling-element part according to claim 5, wherein
    the cooling structure comprises further pins configured to homogenize the cooling fluid flow on at least one end portion of the cooling-element part that forms at least one of an inflow region or an outflow region of the cooling element for the cooling fluid.

13. The cooling-element part according to claim 12, wherein
    the further pins have an elliptical form,
    wherein a main axis of a first set of the further pins are oriented transversely to the direction of the flow, and
    a main axis of a second set of the further pins are oriented along the direction of the flow.

14. The cooling-element part according to claim 3, wherein
    at least some of the further pins are located in the at least one cooling duct beyond an end of the webs in the direction of the flow.

* * * * *